(12) United States Patent
Sato et al.

(10) Patent No.: US 7,163,600 B2
(45) Date of Patent: *Jan. 16, 2007

(54) METHOD FOR PREPARING COPPER FOIL WITH INSULATING LAYER AND COPPER FOIL WITH INSULATING LAYER PREPARED BY THE METHOD, AND PRINTED WIRING BOARD USING THE COPPER FOIL WITH INSULATING LAYER

(75) Inventors: Tetsuro Sato, Ageo (JP); Noriyuki Nagashima, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 198 days.

This patent is subject to a terminal disclaimer.

(21) Appl. No.: 10/250,649

(22) PCT Filed: Nov. 22, 2002

(86) PCT No.: PCT/JP02/12221

§ 371 (c)(1),
(2), (4) Date: Jul. 7, 2003

(87) PCT Pub. No.: WO03/047323

PCT Pub. Date: Jun. 5, 2003

(65) Prior Publication Data

US 2004/0188134 A1    Sep. 30, 2004

(30) Foreign Application Priority Data

Nov. 26, 2001 (JP) .............................. 2001-359367
Jun. 28, 2002 (JP) .............................. 2002-190995
Nov. 11, 2002 (JP) .............................. 2002-326268

(51) Int. Cl.
*B32B 37/00* (2006.01)

(52) U.S. Cl. .............................. 156/307.1; 156/307.3; 156/324; 427/372.2; 427/385.5

(58) Field of Classification Search ................ 156/289, 156/307.1, 307.3, 307.4, 307.5, 307.7, 324; 427/96.1, 372.2, 374.1, 385.5, 386, 388.1, 427/388.4

See application file for complete search history.

(56) References Cited

U.S. PATENT DOCUMENTS 4,087,300 A * 5/1978 Adler .......................... 156/184

(Continued)

FOREIGN PATENT DOCUMENTS

EP          851724 A2     7/1998

(Continued)

OTHER PUBLICATIONS

Webster's Dictionary definition "dry".*

*Primary Examiner*—Jeff H. Aftergut
*Assistant Examiner*—John L. Goff
(74) *Attorney, Agent, or Firm*—Rothwell, Figg, Ernst & Manbeck, P.C.

(57) ABSTRACT

To provide a method of manufacturing a material which can make a skeletal component as thin as possible to be contained in an insulating layer in a manufactured copper clad laminate and can securely prevent the direct contact between the nodular treatment surface of the attached copper foil and a skeletal component. In order to attain the object, here is adopted "a method of manufacturing a copper foil with an insulating layer 1 which method is a method of manufacturing a copper foil provided with a semi-cured insulating resin layer containing a skeletal component on one side surface of the copper foil, and is characterized in that: a first thermosetting resin layer 3 in an uncured or semi-cured state is provided on one side surface of a copper foil 2; a nonwoven fabric 5 or a woven cloth 5 to be a skeletal component is press-bonded onto a first thermosetting resin layer 3; a second thermosetting resin layer 7 is formed on a surface of a press-bonded nonwoven fabric 5 or woven cloth 5; and a semi-cured insulating layer containing the nonwoven fabric 5 or the woven cloth 5 is formed on one side surface of the copper foil 2 by drying into a semi-cured state."

1 Claim, 5 Drawing Sheets

U.S. PATENT DOCUMENTS

| | | | | |
|---|---|---|---|---|
| 4,557,784 A | * | 12/1985 | Uekita et al. | 156/307.7 |
| 4,659,425 A | * | 4/1987 | Eggers et al. | 216/20 |
| 4,909,886 A | * | 3/1990 | Noguchi | 156/285 |
| 5,330,595 A | * | 7/1994 | Held | 156/64 |
| 5,633,042 A | * | 5/1997 | Nakamura et al. | 427/386 |
| 5,965,245 A | | 10/1999 | Okano et al. | |

FOREIGN PATENT DOCUMENTS

| | | |
|---|---|---|
| JP | 6-196862 | 7/1994 |
| JP | 2001-88244 A | 4/2001 |
| JP | 2001-316564 A | 11/2001 |

* cited by examiner

METHOD FOR PREPARING COPPER FOIL WITH INSULATING LAYER AND COPPER FOIL WITH INSULATING LAYER PREPARED BY THE METHOD, AND PRINTED WIRING BOARD USING THE COPPER FOIL WITH INSULATING LAYER

TECHNICAL FIELD

The present invention relates to a method of manufacturing a copper foil with an insulating layer, a copper foil with an insulating layer obtained with the manufacturing method, and a multilayer printed circuit board using the copper foil with an insulating layer.

BACKGROUND ART

As for recent multilayer printed circuit boards, downsizing of the via holes has been rapidly promoted in parallel with the circuit miniaturization required to multilayer printed circuit boards. In this connection, the conventional mechanical drilling machining has become difficult to be applied to such microfabrication, and alternatively the laser drilling machining has been generally prevailing in such microfabrication.

As the laser drilling machining has come into wide use, the multilayer printed circuit boards manufactured by use of the conventional glass-epoxy base material of FR-4 prepreg have proved to be poor in laser drilling workability. It is the glass cloth incorporated as skeletal component in glass-epoxy base material that has been first recognized as problematic. Glass cloth is a woven stuff and glass itself is poor in laser machining workability, and hence drilling with satisfactory precision has been impossible with glass cloth.

Thus, the present inventors have been supplying to the market the copper foil with resin in which exclusively a semi-cured resin layer without incorporating a skeletal component is provided on the surface of the copper foil. Accordingly, it has been made possible to manufacture, with applying the built-up processing method but without using prepreg, the copper clad laminates which are excellent in the laser drilling workability, this situation having made it possible to supply high quality multilayer printed circuit boards. In other words, the copper foil with resin has the characteristics that it is light in weight and excellent in the laser drilling workability owing to the absence of the skeletal component therein, and simultaneously, the copper foil with resin has the following drawbacks owing to the absence of the skeletal component therein.

Namely, there has been a problem that a copper clad laminate manufactured only with the copper foil with resin is insufficient in the mechanical strength of the resin layer thereof against such external forces as bending, tensile, and impact forces. The copper foil with resin has no reinforcing material, and thus the quality control is difficult for a copper clad laminate manufactured only with the copper foil with resin, since the thickness of an insulating layer within a laminate layer varies extremely widely in a system having nonuniform copper circuit densities in the inner layer circuits. The copper foil with resin is a material large in thermal expansion coefficient, and thus tends to generate a stress in the interface with a different type of material, for example, with a copper circuit, resulting in adverse effects to the board reliability. Among other drawbacks pointed out, there is a drawback that a copper clad laminate manufactured only with the copper foil with resin is low in strength so that pads sink into the laminate during wire bonding of IC chips, resulting in failure in obtaining stable bonding.

On the other hand, in the field of prepreg, there have also been supplied products in which the skeletal component is devised so that the laser drilling workability is improved while retaining the above described mechanical strength. To be more specific, it has been said that when glass cloth is used as the skeletal component, the laser drilling workability is generally degraded; accordingly, it has become general to use the nonwoven glass fabric as the skeletal component instead of the woven glass cloth. The use of nonwoven fabric has improved the nonuniformity in cloth thread as seen when the nonwoven fabric is used as the skeletal component, thereby significantly improving the laser drilling workability.

However, as for the prepreg containing a skeletal component, there is usually adopted a method in which the skeletal component is impregnated with a resin component, and then dried, which method accordingly causes problems.

To be more specific, the nonwoven fabric itself is inferior in strength to the woven glass cloth, and accordingly, there has been a drawback that when the impregnated unwoven fabric is taken out of the impregnating resin, sometimes the impregnated nonwoven fabric tends to break adversely owing to the weight of the resin impregnating thereinto. Even with the woven glass cloth, a similar drawback has tended to occur with decreasing cloth thickness. Thus, although it is desirable to use either a thinner nonwoven fabric or a thinner woven cloth, actually there has been a restriction in reducing the thickness of a nowoven fabric or a woven cloth, in consideration of the strength required to the insulating layers incorporated into a fabricated copper clad laminate.

Thus, there has been attempted to supply those prepregs which use either thinner nonwoven fabric or woven cloth, through achieving the object that the insulating resin layer is reduced in thickness for the purpose of weight reduction, and simultaneously reducing the resin content impregnated into the nowoven fabric or the woven cloth. A copper clad laminate is manufactured by press working to make a copper foil adhere onto the surface of a prepreg. In this case, the copper foil has been beforehand subjected to the nodular treatment to form concavities and convexities on the surface thereof, so that the nodular treatment surface of the copper foil go into the resin portion in the base material to increase the adhesion strength through obtaining the anchoring effect; when the impregnated resin amount is made to be equal to or lower than a certain level, the skeletal component and the nodular treatment surface of the copper foil come into contact with each other, resulting in degraded adhesion of the base material resin and thereby resulting in the degraded peel strength of the laminate; and in addition, it has become anticipated that the direct contact between the skeletal component and the copper foil possibly facilitates the migration of the copper foil along the skeletal component fibers.

From the above, there have been desired a material and a method which material and method make it possible to prevent more securely the contact between the nodular treatment surface of the attached copper foil and the skeletal component, through raising the resin content ratio in an insulating resin layer by making the skeletal component incorporated into the insulating resin layer of a fabricated copper clad laminate as thin as possible.

SUMMARY OF THE INVENTION

According to the judgment of the present inventors, as a result of diligent study, as far as the conventional method of manufacturing prepreg is adopted, the skeletal component which can be used with that method cannot be as thin as 120 μm or below for a nonwoven fabric and cannot be as thin as 20 μm or below for a woven cloth; and the available thickness limit as measured for the prepreg impregnated with resin is of the order of 120 μm for a nonwoven fabric and of the order of 30 μm for a woven cloth. Thus, the present inventors have reached an idea that when an insulating resin layer incorporating a skeletal component therein is directly formed on the surface of a copper foil by using the method to be described below, the thickness of the nonwoven fabric or the woven cloth to be used can be reduced, and the total thickness of the insulating layer as a result of a combination of the skeletal component and the resin can be arbitrarily controlled, and in addition, the contact between the nodular treatment surface of the copper foil and the nonwoven fabric or the woven cloth can be securely prevented.

Among the woven skeletal components, some recently developed components are excellent in laser drilling workability. In other words, strands are each opened in a plane shape, and the sectional shapes of the warp strands and weft strands of a woven cloth are flattened, so that the laser drilling workability of the woven cloth which has been inferior in the laser drilling workability as compared with the nonwoven fabric in the past, is used for SP cloth which has the same level as the nonwoven fabric. When such an SP cloth is available, it becomes advantageous to use a woven cloth excellent in the mechanical strengths such as the cracking resistance as compared to the use of a nonwoven fabric. Thus, if such a woven cloth can be applied to the insulating layer in the copper foil with an insulating layer related to the present invention described below, the mechanical strength of the copper foil with such an insulating layer which is easier to use than the prepreg is significantly improved. Incidentally, it is preferable to treat with a silane coupling agent the fibers which constitute either the woven cloth or the nonwoven fabric, both used in the present invention, in order to improve the wetting property of the surfaces thereof to the resin. In this case, as the silane coupling agent, the amino based silane coupling agent, the epoxy based coupling agent, or the like can be used, according to the purpose.

Figure 1:
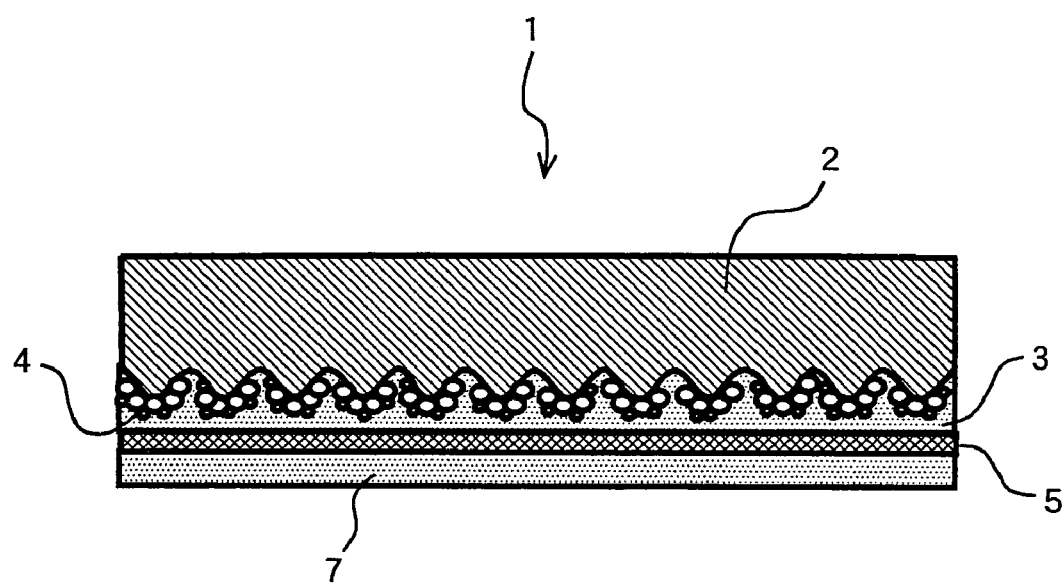
FIG. 1 shows a schematic view of the copper foil with an insulating layer obtained by the manufacturing method related to the present invention.

The invention set forth in the claims is a method of manufacturing a copper foil provided with an insulating semi-cured resin layer on one side surface thereof which resin layer contains a skeletal component, which method is a method of manufacturing a copper foil with an insulating layer and is characterized in that a semi-cured insulating resin layer containing a nonwoven fabric or a woven cloth is formed on one side surface of the copper foil by providing the first semi-cured thermosetting resin layer on one side surface of the copper foil, and press-bonding a skeletal component of either a nowoven fabric or a woven cloth on the first thermosetting resin layer, and then forming the second thermosetting resin layer on the surface of the press-bonded nonwoven fabric or woven cloth and drying in a semi-cured state. FIG. 1 shows a schematic sectional view of the copper foil with an insulating layer.

Now, the manufacturing method is described with reference to FIG. 2 where the process flow is illustrated. At the beginning, as FIG. 2(1) shows, on the one side surface of a copper foil 2 is provided the first semi-cured thermosetting resin layer 3. The copper foil 2 as referred to here may be a copper foil for use as electronic material in printed circuit boards, such as a rolled copper foil obtained by rolling and an electrodeposited copper foil obtained by electrolysis, that is, the foil manufacturing method is not specified to any particular one. The copper foil 2 of the present specification conceptually includes a copper foil with a carrier foil. A copper foil with a carrier foil has the carrier foil on the surface of the copper foil reverse to the surface thereof bonded to a base material, and is processed with press working to be used as a copper clad laminate, and subsequently the pressed copper clad laminate is deprived of the carrier foil to be used as a usual copper clad laminate. The use of a copper foil with a carrier foil has an advantage that the possible attachment of foreign matters on the surface of the copper foil and the possible surface staining during the press working can be prevented, and the surface of the copper foil can be protected against deterioration due to such damages as scratches until just before the etching process.

Generally the epoxy resin is used for the resin constituting the first thermosetting resin layer 3, since it is widely used for use in printed wiring boards. In other words, as for the resin constituting the first thermosetting resin layer, there is no particular limitation except that the resin is provided with thermosetting property and can be used for printed circuit boards in the electric and electronic material fields. The first thermosetting resin layer 3 is formed on the surface of a copper foil by a method in which a liquid resin material prepared by use of a solvent is applied onto the surface of the copper foil, by a method in which the resin film in a semi-cured, state is attached to be laminated onto the surface of the copper foil, or by the like. When a liquid resin material is used, there are blended, for example, epoxy resin, a curing agent, and a curing accelerator, and the viscosity is adjusted for application by using a solvent such as methyl ethyl ketone.

The first thermosetting resin layer 3 formed on the surface of the copper foil is maintained in a semi-cured state, in order to thereby make a satisfactory press-bonding of a nonwoven fabric 5 or a woven cloth 5, and to promote a certain amount of resin impregnation into the unwoven fabric or the woven cloth. Accordingly, when a liquid resin material is applied onto the surface of the copper foil 2, and then the resin layer is transformed into a semi-cured state, it is necessary to adjust the dryness level and curing degree by using a hot air drying device, and the like.

The thickness of the first thermosetting resin layer 3 formed on the surface of the copper foil 2 is determined in consideration of the thickness of the nonwoven fabric 5 or the woven cloth 5 to be described below. In other words, the thickness of the first thermosetting resin layer 3 should be equal to or smaller than that of the unwoven fabric 5 or that of the woven cloth 5. When the thickness of the first thermosetting resin layer 3 is made to be larger than that of the unwoven fabric 5 or that of the woven cloth 5, the resin constituting the first thermosetting resin layer 3 tends to flow out to pollute the processing device during press-bonding of the unwoven fabric 5 or the woven cloth 5; in particular, when the press roll 6 is polluted, the polluting matter is transferred onto the surface of the copper foil 2 being processed, resulting in product quality degradation.

On the other hand, the lowest limit for the thickness of the first thermosetting resin layer 3 can be determined on the basis of the following consideration. The first thermosetting resin layer 3 is formed on the roughened surface 4 of the copper foil 2 having concavities and convexities, and hence it is necessary for the thickness of the first thermosetting resin layer 3 to have at least a certain value sufficient to completely cover over these concavities and convexities. When these concavities and convexities of the roughened surface 4 cannot be completely covered over, these concavities and convexities of the roughened surface 4 of the copper foil 2 come into direct contact with the nonwoven fabric 5 or the woven cloth 5, failing to achieve the object of the present invention.

Thus, in consideration of fact that the thickness of a copper foil used as an inner layer circuit and subjected to the laser drilling machining is generally 18 μm or below, research has been made repeatedly on the basis of the condition that the 10 point average roughness (Rz) of the roughened surface of a copper foil of 18 μm in nominal thickness is 4.0 μm or below. As a result, the following estimation has been able to be obtained: by use of either the resin amount to form a resin layer of 3.0 μm in thickness when applied onto a smooth surface or a resin film of 3.0 μm or above in thickness, the roughened surface of a copper foil of 18 μm or below in nominal thickness can be securely covered over, and such an amount of resin can be left between the roughened surface of the copper foil and the nonwoven fabric or the woven cloth that can circumvent the direct contact of the concavities and convexities of the roughed surface with the nonwoven fabric or the woven cloth, even taking account of the impregnation amount of the resin fluidized again when the nonwoven fabric or the woven cloth is press-bonded, and moreover even when press working is made. From the above, it is preferable that the first thermosetting resin layer is 3 μm or above in thickness as converted to the value for the flat plane, and in addition thinner than the nonwoven fabric used as a skeletal component of 50 μm or below in thickness or the woven cloth used as a skeletal component of 20 μm or below. Here, the thickness of 3.0 μm converted to the value for the flat plane means the value of 3.0 μm obtained when a certain amount of resin is applied onto a smooth surface without concavities and convexities; this refers to a concept generally applied when an application amount onto a surface with concavities and convexities is determined.

Figure 2:
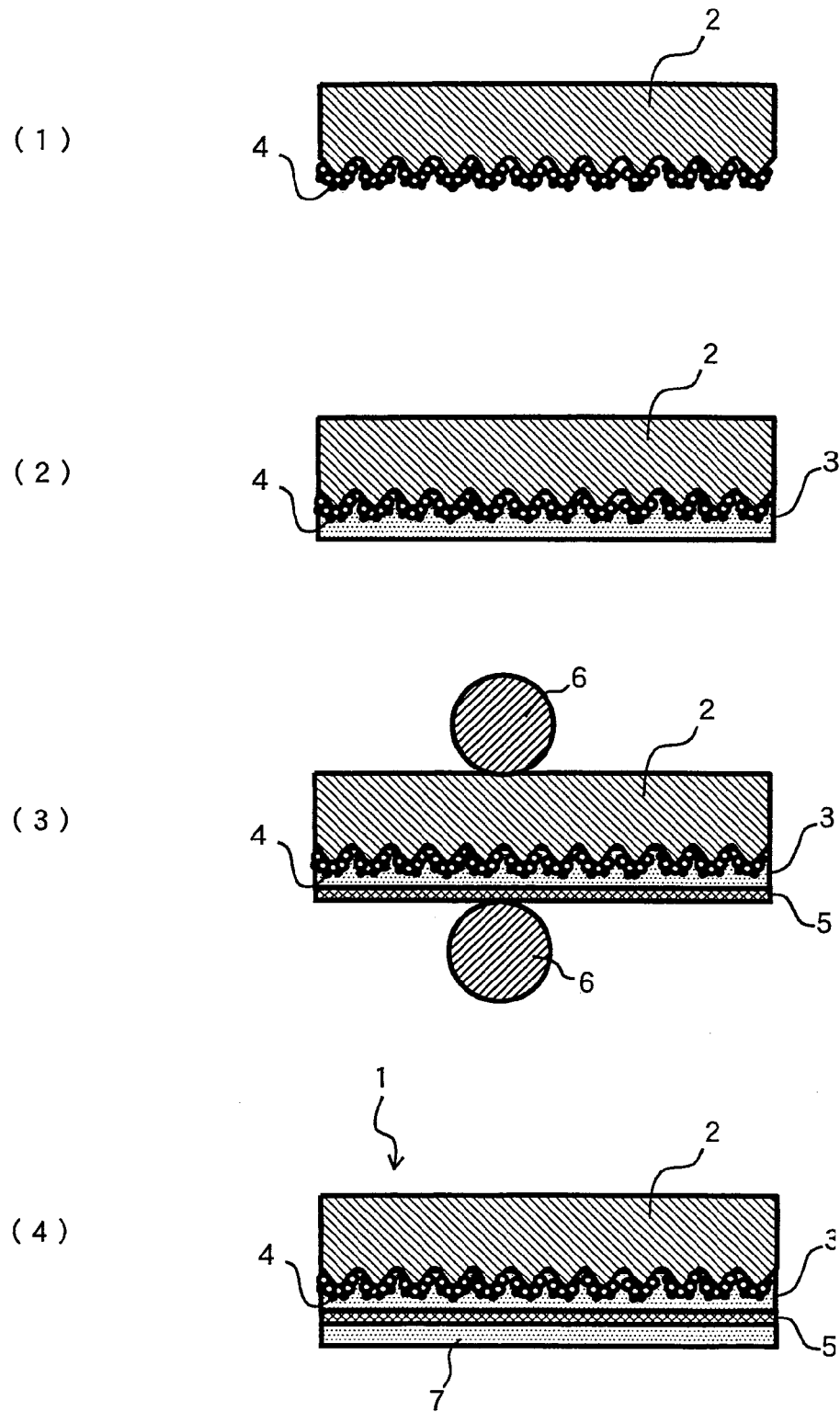
FIGS. 2 and 3 each shows a schematic view of a production flow of a copper foil with an insulating layer.

When the first thermosetting resin layer 3 is formed on the surface of the copper foil 2 as described above, then the nonwoven fabric 5 or the woven cloth 5 is attached to the first thermosetting resin layer 3 by use of the press roll 6 as shown in FIG. 2(3). The nonwoven fabric 5 or the woven cloth 5 becomes the skeletal component, and are used to overcome the poor mechanical strength of the conventional copper foils with resin. The nonwoven fabric 5 or the woven cloth 5 is attached on the thermosetting resin layer 3 by applying a load with the press roll. When the nonwoven fabric 5 or the woven cloth 5 is attached on the first thermosetting resin layer 3 in a semi-cured state, it is necessary to attach the nonwoven fabric 5 or the woven cloth 5 by using a press roll equipped with a heating device, while heating the roll itself and applying a load of pressure higher than a certain level. This is because the resin in a semi-cured state is fluidized again, and a certain amount of the resin fluidized again is impregnated into the nonwoven fabric or the woven cloth.

It is preferable to use the nonwoven fabric or the woven cloth made of any of a glass fiber, an aramid fiber, and a wholly aromatic polyester fiber having a melting point of 300° C. or above (hereinafter, simply referred to as "a wholly aromatic polyester fiber"), as the nonwoven fabric 5 or the woven cloth 5 used here. Because, both glass fiber and aramid fiber have been used actually for long years for the printed circuit boards and are thus highly reliable materials. The wholly aromatic polyester fiber having a melting point of 300° C. or above is a fiber made of a resin referred to as a liquid crystal polymer, and the liquid crystal polymer has as the main component a polymer made of 2-hydroxy-6-naphthoic acid and p-hydroxybenzoic acid both represented by the formula (1). The wholly aromatic polyester fiber has a low dielectric constant and a low dielectric dissipation factor, and accordingly displays excellent performance as a material for composing an electrically insulating layer, so that the wholly aromatic polyester fiber can be used similarly to the glass fiber and aramid fiber. However, it is not necessary to particularly limit the material of the nonwoven fabric or the woven cloth, but any material is acceptable which can be used for printed circuit boards and has sufficient mechanical characteristics.

Chemical formula 1

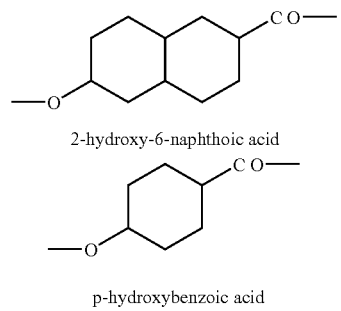

2-hydroxy-6-naphthoic acid p-hydroxybenzoic acid

There is no particular limitation for the thickness of the nonwoven fabric 5 or the woven cloth 5, but as described for the object of the present invention, it becomes possible to use the thin nonwoven fabric or the thin woven cloth of 50 μm or below in thickness which has not been able to be used heretofore. According to the conventional method in which a nonwoven fabric or a woven cloth is dipped into a resin material to impregnate the resin material into the nonwoven fabric or the woven cloth, taken out of the resin material, and dried into a semi-cured state to form a prepreg, a thin nonwoven fabric of 50 μm or below in thickness or a thin woven fabric of 20 μm or below in thickness tends to be easily broken or damaged owing to being weak in mechanical strength; even if the break or the damage does not occur, the nonwoven fabric or the woven cloth is pulled by the tension along the lengthwise direction to be elongated, and as a result there occurs a large difference between the longitudinal and the transverse expansion and contraction coefficients of the manufactured prepreg, which results in a significant deficiency in the dimensional stability as considered to be important in what is called, a precise printed circuit boards.

On the other hand, when the method of manufacturing a copper foil with an insulating layer 1 related to the present invention is adopted, no break or no damage occurs even with a nonwoven fabric as thin as 50 μm or below or with a woven cloth as thin as 20 μm or below. According to the current level of the technique for manufacturing nonwoven fabrics or woven cloths, the minimum thickness limit available within the sufficient guarantee of quality is said to be 45 μm for a nonwoven fabric and 20 μm for a woven cloth. In the future a further thinner nonwoven fabric or woven cloth can be expected to be manufactured. However, generally even when a heavy part such as a flyback transformer of a television set is mounted directly on a printed circuit board, the bending strength of 200 MPa of the board, as assumed to be an insulating resin board to be described in an embodiment, is said to be sufficient to wear under the usual usage conditions, so that it is contemplated that the thickness of a nonwoven fabric or a woven cloth may be properly selected to be able to clear the above described strength.

When the attachment of the nonwoven fabric or the woven cloth is completed as described above, then a resin constituting the second thermosetting resin layer 7 is applied onto the nonwoven fabric or the woven cloth, as FIG. 2(4) shows, to form the second thermosetting resin layer 7; similarly to the case of the first thermosetting resin layer 3, the epoxy resin is generally used. However, as for the resin for constituting the second thermosetting resin layer 7, there is no need to set a particular limitation except that it is a resin which is provided with thermosetting property and can be used for the printed circuit board in the electric and electronic material fields, similarly to the case of the first thermosetting resin layer 3. As the method for forming the second thermosetting resin layer 7, the method for forming the first thermosetting resin layer 3 can be similarly applied.

The second thermosetting resin layer 7 formed on the surface of the copper foil should be maintained in a semi-cured state. This is because the copper foil with an insulating layer is laminated in combination with another printed circuit board material, and press-molded to be used as a component constituting a printed circuit board.

The thickness of the second thermosetting resin layer 7 is determined as described below in consideration of the thickness of the nonwoven fabric 5 or the woven cloth 5. Namely, since as described above, the thickness of the first thermosetting resin layer 3 is equal to or less than the thickness of the nonwoven fabric 5 or the woven cloth 5, there is a high possibility that the resin constituting the first thermosetting resin layer 3 alone is insufficient to yield a state wherein the resin constituting the first thermosetting resin layer 3 completely coats the nonwoven fabric or the woven cloth, even when the first thermosetting resin layer 3 is press-bonded to the nonwoven fabric 5 or the woven cloth 5 to fluidize the resin constituting the first thermosetting resin layer 3. Accordingly, the second thermosetting resin layer 7 should be formed with the thickness capable of completely coating at least the surface of the nonwoven fabric 5 or the woven cloth 5.

Moreover, the thickness of the second thermosetting resin layer 7 should be a certain value which can prevent the direct contact of the concavities and convexities of the roughened surface of the copper foil with the nonwoven fabric or the woven cloth when the copper foil 2 is attached by the press molding to the second thermosetting resin layer 7. Namely, on the basis of the same idea as applied to the first thermosetting resin layer 3, it can be assessed that the thickness of the second thermosetting resin layer 7 needs to be 5.0 μm or above. The thickness of the second thermosetting resin layer, as referred to here, means that the thickness converted to the value on the flat surface is 5.0 μm or above, similarly to the case of the first thermosetting resin layer.

As another method for obtaining a product similar to the copper foil with an insulating layer obtained with the above described manufacturing method, here is a method set forth in a claim as follows: a method of manufacturing a copper foil provided with, on one side surface of the copper foil, a semi-cured insulating layer containing as a skeletal component a nonwoven fabric or a woven cloth; and the method of manufacturing a copper foil with an insulating layer is characterized in that a semi-cured insulating layer containing a nonwoven fabric or a woven cloth is formed on one side surface of the copper foil as follows: a liquid thermosetting resin layer is provided on one side surface of the copper foil, on which layer a nonwoven fabric or a woven cloth is superposed as a skeletal component; the resin constituting the thermosetting resin layer is made to impregnate into the nonwoven fabric or the woven cloth so as to exude from the opposite side so that the nonwoven fabric or the woven cloth is coated with the resin constituting the thermosetting resin layer, and the impregnated woven fabric or the impregnated woven cloth is dried into a semi-cured state.

Figure 3:
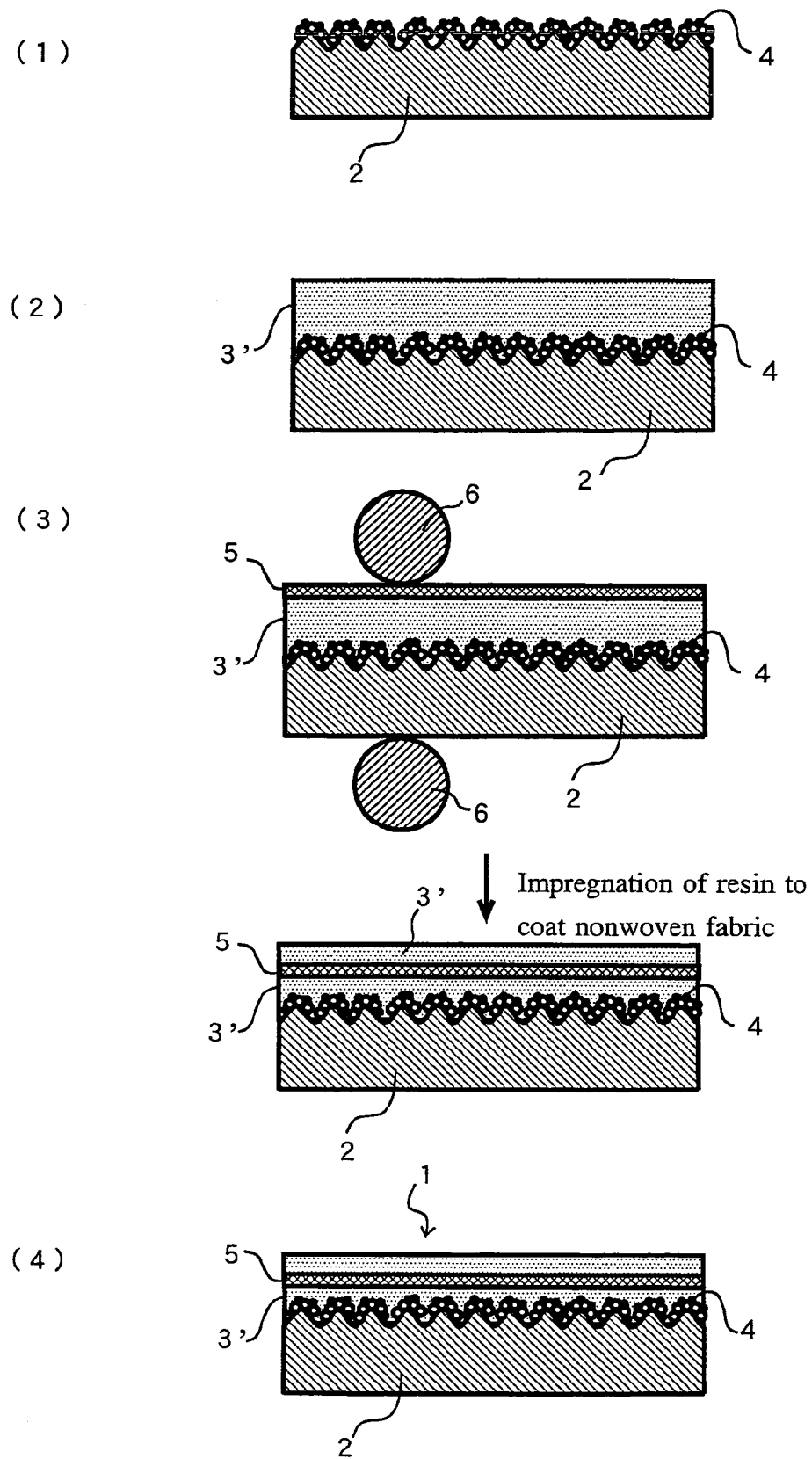

The above manufacturing method is conceptually illustrated in FIG. 3 as a flow of production. On one side surface of a copper foil 2 shown in FIG. 3(1), a liquid thermosetting resin layer 3' is provided as shown in FIG. 3(2), a nonwoven fabric 5 or a woven cloth 5 is superposed on the surface of the thermosetting resin layer 3', the resin component constituting the thermosetting resin layer 3' is impregnated into the nonwoven fabric 5 or the woven cloth 5 under favor of the capillary phenomenon exhibited by any fiber of the glass fiber, the aramid fiber, and the wholly aromatic polyester fiber constituting the nonwoven fabric 5 or the woven cloth 5 so as to exude from the side surface of the nonwoven fabric 5 or the woven cloth 5 reverse to the surface thereof in contact with the thermosetting resin layer 3', and thus the surface of the nonwoven fabric 5 or the woven cloth 5 is completely coated with the resin to yield a copper foil with an insulating layer as shown in FIG. 3(4).

In the process shown in FIG. 3(3), it is preferable to coat the nonwoven fabric 5 or the woven cloth 5 with the resin by impregnating the resin into the nonwoven fabric 5 or the woven cloth 5 in consideration of the following conditions. Namely, the thermosetting resin layer 3' in an absolutely liquid state is produced by applying onto the surface of the copper foil, and hence the resin layer generally contains a large amount of solvent; thus, when the nonwoven fabric 5 or the woven cloth 5 is superposed on the surface of the resin layer absolutely without removing the solvent and is subjected to the following processes, bubbles tend to be generated in the thermosetting resin layer 3' interposed between the copper foil 2 and the nonwoven fabric 5 or the woven cloth 5 during finally transforming to a semi-cured state. Accordingly, it is preferable to remove a certain amount of solvent, so that the bubble generation can be prevented, before the superposition of the nonwoven fabric 5 or the woven cloth 5 on the surface of the thermosetting resin layer 3'. The solvent may be removed either simply by air drying, or by heating within the temperature range not exceeding the curing temperature. The solvent removing level can be optionally adjusted in consideration of the thickness of the thermosetting resin layer 3' and the thickness of the nonwoven fabric 5 or the woven cloth 5 so that the bubble generation can be suppressed.

The removal of the solvent from the resin component in the thermosetting resin layer 3', before the nonwoven fabric 5 or the woven cloth 5 is superposed, is nothing else that the so-called semi-cured state is formed. In such a case, it is necessary that the resin in the semi-cured thermosetting resin layer 3' is impregnated into the nonwoven fabric 5 or the woven cloth 5 under favor of the capillary phenomenon exhibited by any fiber of the glass fiber, the aramid fiber, and the wholly aromatic polyester fiber constituting the nonwoven fabric 5 or the woven cloth 5 so as to exude from the side surface of the nonwoven fabric or the woven cloth 5 reverse to the surface thereof in contact with the thermosetting resin layer 3'. Thus, in such a case, the heating is made at a temperature not exceeding the curing temperature to fluidize again the thermosetting resin layer 3'.

The thermosetting resin layer 3' as referred to in the present method is preferably X-30 ($\mu$m) to X-3 ($\mu$m) in thickness in relation to the thickness (X ($\mu$m)) of the formed insulating layer. For example, when the thickness of the insulating layer is made to be 100 $\mu$m, the liquid resin is applied onto the surface of the copper foil with the thickness of the thermosetting resin layer 3' in the range from 100−30=70 $\mu$m to 100−3=97 $\mu$m. In this way, it becomes possible to form the insulating layer with the aimed thickness on the surface of the copper foil 2. When the thickness of the thermosetting resin layer 3' is made to be less than X-30 ($\mu$m), the final adhesion between the insulating layer and the copper foil layer cannot be sufficiently high, while when the thickness of the thermosetting layer 3' is made to exceed X-3 ($\mu$m), there occurs also no augmenting effect of improving the adhesion between the insulating layer and the copper foil layer. Incidentally, the thickness as referred to here means the above described thickness as converted to the value on the flat plane.

Among others, as for the copper foil, the nonwoven fabric or the woven cloth, and the thermosetting resin layer, and the like, the present method is the same as the aforementioned method, and the same materials and the same conditions can be adopted. Accordingly, here are avoided the duplicate descriptions.

The copper foil with an insulating layer obtained by use of the above described method is suitably used for the usual printed circuit boards, materials for the printed circuit boards for use in capacitor layer formation, and the like (in the present specification, all these boards and materials are generically referred to as "printed circuit boards"), and can maintain the quality of the printed circuit boards with a satisfactory balance owing to the above described effects.

BEST MODE FOR CARRYING OUT THE INVENTION

More detailed description will be made below on the present invention with reference to the Examples of production of the copper foils with an insulating layer related to the present invention.

EXAMPLE 1

In the present Example, according to the flow of production shown in FIG. 2, a copper foil with an insulating layer 1 was fabricated using an electrodeposited copper foil 2 which had a nominal thickness of 18 $\mu$m and a surface roughness (Rz) of 3.5 $\mu$m for the roughened surface 4 on which the first thermosetting resin layer 3 was formed.

At the beginning, an epoxy resin composition was prepared which was used for forming the first thermosetting resin layer 3 and the second thermosetting resin layer 7; bisphenol-A type epoxy resin (brand name: YD-128, Toto Kasei Co., Ltd.) (30 wt %), o-cresol type epoxy resin (brand name: ESCN-195XL80, Sumitomo Chemical Co., Ltd.) (50 wt %), both as resins, dicyandiamide as an epoxy resin curing agent in the form of a dimethylforamide solution with 25% solid content (4 wt % as dicyandiamide) (16 wt %), and 2-ethyl-4-methylimidazole as a curing accelerator (brand name: Cazole 2E4MZ, Shikoku Corp.) (0.1 wt %) were dissolved in a mixed solvent composed of methyl ethyl ketone and dimethylformamide (mixing ratio: methyl ethyl ketone/dimethyl formamide=4/6) to obtain an epoxy resin composition containing a solid content of 60%.

The epoxy resin composition was applied uniformly onto the roughened surface 4 of the electrodeposited copper foil 2 of 18 $\mu$m in nominal thickness, and the thus treated copper foil was allowed to stand at room temperature for 30 minutes; a certain amount of solvent was removed by blasting hot air at 150° C. for 2 minutes with a hot air dryer, and the first thermosetting resin layer 3 was dried into a semi-cured state. In this case, the applied amount of the epoxy composition was so adjusted that the resin thickness became 40 $\mu$m after drying.

Then, a nonwoven fabric 5 made of an aramid fiber of 50 $\mu$m in nominal thickness was attached onto the first thermosetting resin layer 3. This attachment was performed in such a way that the nonwoven fabric 5 was superposed on the surface of the formed first thermosetting resin layer 3, and the thus treated copper foil was made to pass through the heat roll 6 heated to 150° C. with the applied lamination pressure of 9 kg/cm$^2$ in a delivery rate of 20 cm/minute. Consequently, the total average thickness of the first thermosetting resin layer 3 and the nonwoven fabric 5 in an attached state was 55 $\mu$m.

On completion of the attachment of the nonwoven fabric 5, then the second thermosetting resin layer 7 was formed. The epoxy resin composition used for forming the second thermosetting resin layer 7 was the same as that used for forming the first thermosetting resin layer 3. Accordingly, description on the epoxy resin composition is omitted here to avoid a duplicate description.

The epoxy resin composition was uniformly applied onto the attached nonwoven fabric 5, and the thus treated copper foil was allowed to stand at room temperature for 30 minutes; a certain amount of solvent was removed by blasting hot air at 150° C. for 3 minutes with a hot air dryer, and the second thermosetting resin layer 7 was dried into a semi-cured state. In this case, the applied amount of the epoxy resin composition was so adjusted that the total thickness of the first thermosetting resin layer 3, nonwoven fabric 5, and second thermosetting resin layer 7 after drying became 75 $\mu$m. As above, the copper foil with an insulating layer 1 was fabricated by use of the manufacturing method related to the present invention.

Figure 4:
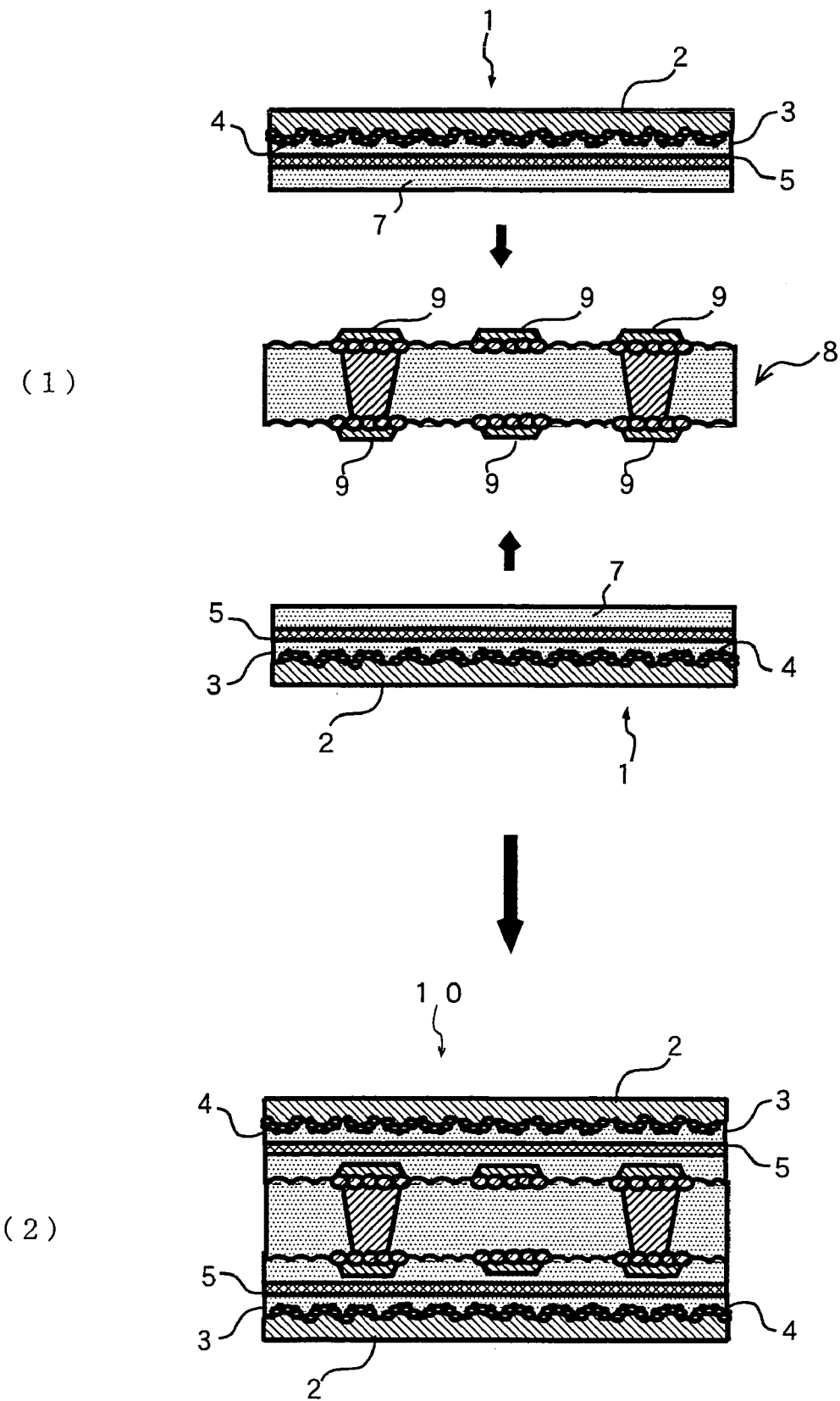
FIG. 4 shows the lamination concept and schematic sectional views of a multilayer copper clad laminate for use in evaluation.

According to the flow of production illustrated in FIG. 4, using the copper foil with an insulating layer 1 and an inner layer core component 8 (made of an FR-4 material; the board thickness 0.6 mm, the copper foil thickness 35 $\mu$m) with inner layer circuits 9 on the surfaces thereof, a multilayer copper clad laminate 10 for use in performance evaluation was fabricated; as FIG. 4(1) shows, the inner layer core component 8 as a central component, and two sheets of the copper foil with an insulating layer 1, with one sheet on each of the two side surfaces of the core component 8, were laminated with the insulating layer of each copper foil 1 in contact with one of the outer surfaces of the core component 8, and were subjected to the press working to fabricate the multilayer copper clad laminate 10. In this case, the press working conditions were that the press temperature was 180° C., the press pressure was 20 kg/cm², and the curing time was 90 minutes.

Figure 5:
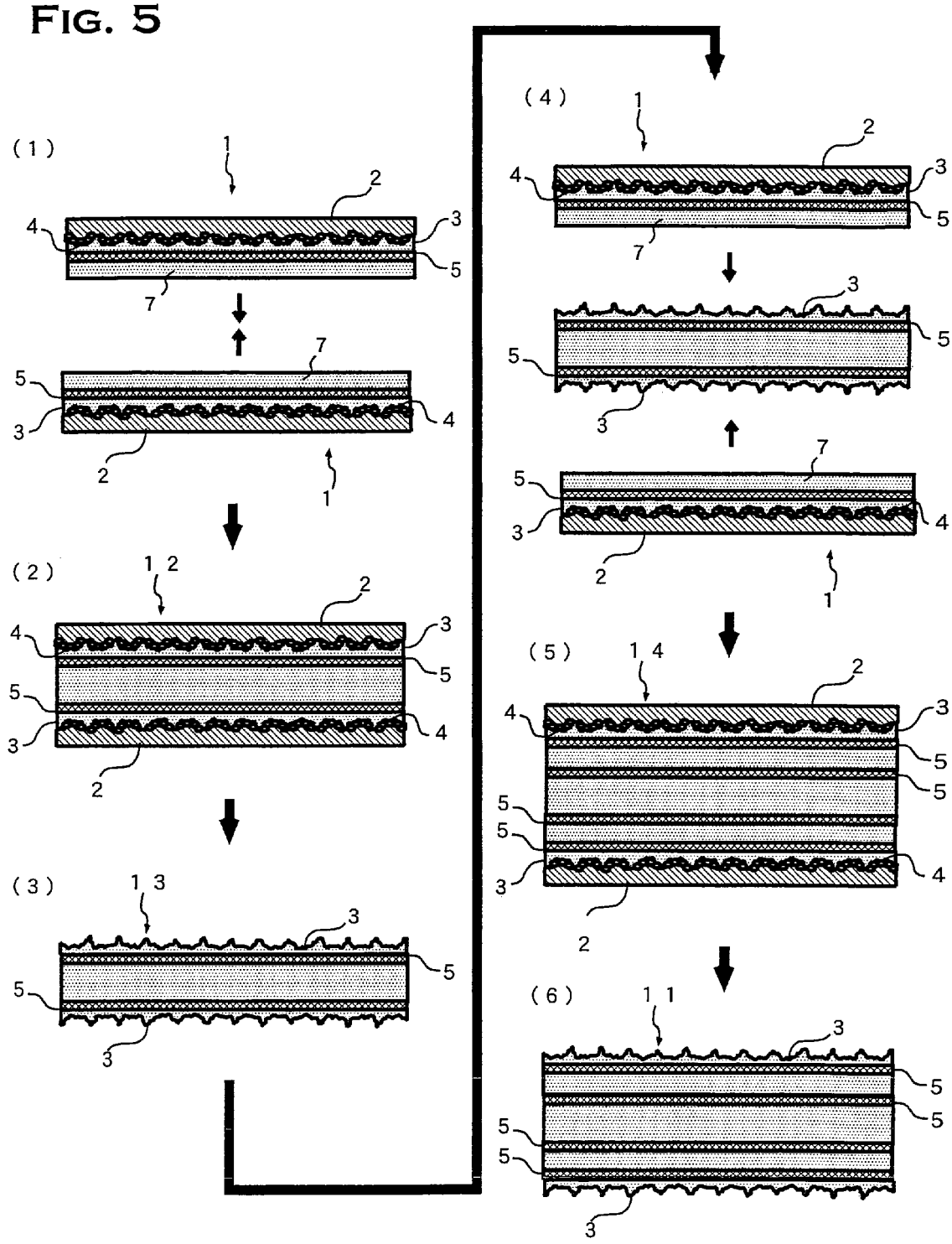
FIG. 5 shows schematically a production flow of an insulating resin board for use in evaluation, and the schematic sectional views of the insulating resin board.

Furthermore, according to the flow of production illustrated in FIG. 5, an insulating resin board 11 for use in evaluation to be used for performance evaluation was fabricated. As FIG. 5(1) shows, two sheets of copper foil with an insulating layer were laminated with the insulating layers superposed with each other, and were attached to each other under the press working conditions that the press temperature was 180° C., the press pressure was 20 kg/cm², and the curing time was 90 minutes, to obtain the first double-sided copper clad laminate 12 as FIG. 5(2) shows. Then, the copper foils on the two side surfaces of the first double-sided copper clad laminate were removed by etching to yield a resin board 13 as FIG. 5(3) shows. Then, as FIG. 5(4) shows, two sheets of copper foil with an insulating layer 1 were laminated on the resin board 13 with one sheet to each side surface of the resin board 13 and with the insulating layer of each copper foil with an insulating layer 1 in contact with one of the outer layer surfaces of the resin board 13, and were attached to each other under the press working conditions that the press temperature was 180° C., the press pressure was 20 kg/cm², and the curing time was 90 minutes, to obtain the second double-sided copper clad laminate 14. The copper foils on the both side surfaces of the laminate 14 were removed by etching to fabricate an insulating resin board 11 for use in evaluation as FIG. 5(6) shows.

The performance evaluation results for the multilayer copper clad laminate 10 and the insulating resin board 11 for use in evaluation are collected in Table 1 so that comparison is possible with the Comparative Examples to be described below.

EXAMPLE 2

In the present Example, a copper foil with an insulating layer 1 was fabricated according to the flow of production conceptually shown in FIG. 3 by using an electrodeposited copper foil 2 which had a nominal thickness of 18 μm and a surface roughness (Rz) of 3.5 μm for the roughened surface 4 on which the thermosetting resin layer 3' was formed.

The epoxy resin composition used for forming the thermosetting resin layer 3' was the same as that used in Example 1. Accordingly, here is made no description on the epoxy resin composition to avoid a duplicate description.

The epoxy resin composition was applied uniformly onto the roughened surface 4 of the electrodeposited copper foil 2 of 18 μm in nominal thickness, and the thus treated copper foil was allowed to stand at room temperature for 30 minutes; a certain amount of solvent was removed by blasting hot air at 150° C. for 2 minutes with a hot air dryer, and the first thermosetting resin layer 3 was dried into a semi-cured state to result in the resin thickness of 80 μm.

Then, a nonwoven fabric 5 made of an aramid fiber of 50 μm in nominal thickness was attached onto the semi-cured thermosetting resin layer 3'. This attachment was performed in such a loose way that the nonwoven fabric 5 was superposed on the surface of the formed first thermosetting resin layer 3', and the thus treated copper foil was made to pass through the heat roll 6 heated to 100° C. with the applied lamination pressure of 5 kg/cm² in a delivery rate of 50 cm/minute. Consequently, the total average thickness of the nonwoven fabric 5 and the thermosetting resin layer 3' was 110 μm; neither resin exudation from the surface of the nonwoven fabric 5 nor the resin transfer to the heat roll 6 occurred.

On completion of the attachment of the nonwoven fabric 5 as described above, the thermosetting resin layer 3' was fluidized again by maintaining an atmosphere of 150° C. for 1 minute with a hot air dryer, the resin component constituting the thermosetting resin layer 3' was impregnated into the nonwoven fabric 5 under favor of the capillary phenomenon exhibited by the aramid fiber constituting the nonwoven fabric 5 so as to exude from the side surface of the nonwoven fabric reverse to the surface thereof in contact with the thermosetting resin layer 3', and thus the surface of the nonwoven fabric 5 was completely coated with the resin to yield a copper foil with an insulating layer as shown in FIG. 3(4). In this case, the total thickness of the thermosetting resin layer 3' and the nonwoven fabric 5 was 90 μm after drying.

A multilayer copper clad laminate 10 was fabricated according to the method illustrated in FIG. 4 similar to that in Example 1, while an insulating resin board 11 for use in evaluation to be used in performance evaluation was fabricated according to the flow of production illustrated in FIG. 5, and the performance evaluation similar to that in Example 1 was performed. The performance evaluation results for the multilayer copper clad laminate 10 and the insulating resin board 11 for use in evaluation, fabricated as described above, are collected in Table 1 so that comparison is possible with the Comparative Examples to be described below.

EXAMPLE 3

In the present Example, according to the flow of production shown in FIG. 2, a copper foil with an insulating layer 1 was fabricated with the same method as that in Example 1, except that, contrary to the nonwoven fabric used as a skeletal component in Example 1, a woven cloth of 20 μm in thickness was used as a skeletal component which cloth was an SP glass cloth made of the above described flattened thread and excellent in the laser drilling workability. Incidentally, the same reference numeral is to be used for the SP glass cloth as that for the nonwoven fabric.

Now, the matters different form those in Example 1 are described below. The epoxy resin composition was uniformly applied onto the roughened surface 4 of the electrodeposited copper foil of 18 μm in nominal thickness, and the thus treated copper foil was allowed to stand at room temperature for 30 minutes; a certain amount of solvent was removed by blasting the hot air at 150° C. for 2 minutes with a hot air dryer, and the first thermosetting resin layer 3 was dried into a semi-cured state. The applied amount of the epoxy resin composition was so adjusted that the resin layer thickness was 15 μm after drying.

Then, the SP glass cloth 5 of 20 μm in nominal thickness was attached onto the first thermosetting resin layer 3. This attachment was performed in such a way that the SP glass cloth 5 was superposed on the surface of the formed first thermosetting resin layer 3, and the thus treated copper foil was made to pass through the heat roll 6 heated to 150° C. with the applied lamination pressure of 9 kg/cm² in a delivery rate of 20 cm/minute. Consequently, the total average thickness of the first thermosetting resin layer 3 and the SP glass cloth 5 in an attached state was 32 μm.

On completion of the attachment of the SP glass cloth 5, successively the second thermosetting resin layer 7 was formed. The epoxy resin composition used for forming the second thermosetting resin layer 7 was the same as that used for forming the first thermosetting resin layer 3. Accordingly, here is omitted the description on the epoxy resin composition in order to avoid a duplicate description.

The epoxy resin composition was uniformly applied onto the attached SP glass cloth 5, and the thus treated copper foil was allowed to stand at room temperature for 30 minutes; a certain amount of solvent was removed by blasting the hot air at 150° C. for 3 minutes with a hot air dryer, and the second thermosetting resin layer 7 was dried into a semi-cured state. In this case, the applied amount of the epoxy resin composition was so adjusted that the total thickness of the first thermosetting resin layer 3, the SP glass cloth 5, and the dried second thermosetting resin layer 7 was 40 µm. As above, the copper foil with an insulating layer 1 was fabricated by using the manufacturing method related to the present invention.

In addition, according to the flow of production illustrated in FIG. 4, an insulating resin board 11 for use in evaluation shown in FIG. 5(6) was fabricated on the basis of the method similar to that in Example 1.

The performance evaluation results for the multilayer copper clad laminate 10 and the insulating resin board 11 for use in evaluation, fabricated as described above, are collected in Table 1 so that comparison is possible with the Comparative Examples to be described below.

EXAMPLE 4

In the present Example, according to the flow of production conceptually shown in FIG. 3, a copper foil with an insulating layer 1 was fabricated with the same method as that in Example 2, except that, contrary to the nonwoven fabric used as a skeletal component in Example 1, a woven cloth of 20 µm in thickness was used as a skeletal component which cloth was an SP glass cloth made of the above described flattened thread and excellent in the laser drilling workability. Incidentally, the same reference numeral is to be used for the SP glass cloth as that for the nonwoven fabric.

Now, the matters different form those in Example 2 are described below. The epoxy resin composition was uniformly applied onto the roughened surface 4 of the electrodeposited copper foil 2 of 18 µm in nominal thickness, and the thus treated copper foil was allowed to stand at room temperature for 30 minutes; a certain amount of solvent was removed by blasting the hot air at 150° C. for 2 minutes with a hot air dryer, and the first thermosetting resin layer 3 was dried into a semi-cured state to have a thickness of 36 µm.

Then, an SP gals cloth 5 of 20 µm in nominal thickness was attached onto the semi-cured thermosetting resin layer 3'. This attachment was performed in such a loose way that the SP glass cloth 5 was superposed on the surface of the formed thermosetting resin layer 3', and the thus treated copper foil was made to pass through the heat roll 6 heated to 100° C. with the applied lamination pressure of 5 kg/cm² in a delivery rate of 50 cm/minute. Consequently, the total thickness of the SP glass cloth 5 and the thermosetting resin layer 3' was 56 µm. Neither resin exudation from the surface of the SP glass cloth 5 nor resin transfer to the heat roll 6 occurred.

On completion of the attachment of the SP glass cloth 5 as described above, the thermosetting resin layer 3' was fluidized again by maintaining in an atmosphere of 150° C. for 1 minute by using a hot air dryer, and the resin component constituting the thermosetting resin layer 3' was impregnated into the SP glass cloth under favor of the capillary phenomenon exhibited by the fiber constituting the SP glass cloth 5, so as to exude from the side surface of the SP glass cloth 5 reverse to the surface thereof in contact with the thermosetting resin layer 3', and thus the surface of the SP glass cloth 5 was completely coated with the resin to yield a copper foil with an insulating layer as shown in FIG. 3(4). In this case, the total thickness of the thermosetting resin layer 3' and the SP glass cloth 5 was 42 µm.

Then, a multilayer copper clad laminate 10 was fabricated according to the method shown in FIG. 4 similar to that in Example 1, while an insulating resin board 11 for use in evaluation to be used in performance evaluation was fabricated according to the flow of production shown in FIG. 5, and the performance evaluation similar to that in Example 1 was performed. The performance evaluation results obtained for the multilayer copper clad laminate 10 and the insulating resin board 11 for use in evaluation, fabricated as described above, are collected in Table 1 so that comparison is possible with the Comparative Examples to be described below.

COMPARATIVE EXAMPLE 1

In the present Comparative Example, the same resin composition as used in Example 1 was uniformly applied onto the roughened surface of an electrodeposited copper foil of 18 µm in nominal thickness, and the thus treated copper foil was allowed to stand at room temperature for 30 minutes; a certain amount of solvent was removed by blasting the hot air at 150° C. for 5 minutes with a hot air dryer, and the resin layer was dried into a semi-cured state to yield a copper foil containing no conventional skeletal component. In this case, the applied amount of the epoxy resin composition was so adjusted that the thickness of the resin layer was 75 µm after drying.

By using the copper foil with resin in place of the copper foils with an insulating layer 1 used in Examples described above, a multilayer copper clad laminate and an insulating resin board were fabricated according to the methods similar to those in Example 1, and were subjected to the performance evaluation. The performance evaluation results are shown in Table 1 to be described below in comparison with the results of Examples.

COMPARATIVE EXAMPLE 2

An epoxy resin composition was newly prepared by adding methyl ethyl ketone to the epoxy resin composition in such a way that the solid content of the newly prepared composition was 50%. The newly prepared composition was impregnated into a glass cloth (a conventional woven cloth for use in FR-4 without improvement for the laser drilling workability) of 60 µm in thickness. The impregnated glass cloth was allowed to stand at room temperature for 30 minutes, and a certain amount of solvent was removed by blasting the hot air at 150° C. for 5 minutes to prepare a prepreg. The thickness of the prepreg was made to be 75 µm after drying.

A multilayer copper clad laminate was fabricated by using the prepreg obtained and by attaching the electrodeposited copper foil of 18 µm in thickness onto the outer layers of the inner layer core component used in Examples. The multilayer copper clad was a multilayer printed circuit board which had a layer structure similar to those in Examples, and in which the inner core component occupies the central portion, the prepreg was superposed onto both outer layers of the inner layer core component, and a copper foil of 18 µm in thickness was laminated onto the outer surface of each prepreg layer. The press conditions for this case was similar to those in Examples, so that description is omitted on the conditions to avoid a duplicate description.

A resin board for use in evaluation was fabricated in such a way that 4 sheets of prepreg were laminated and interposed between the two sheets of mold-releasing paper, and subjected to press working under the conditions that the press temperature was 180° C., the press pressure was 20 kg/cm$^2$, and the curing time was 90 minutes. The multilayer copper clad laminate and insulating resin board for use in evaluation fabricated as described above were subjected to the performance evaluation. The evaluation results obtained are shown in Table 1 to be described below in comparison with Examples.

Evaluation Methods and Evaluation Results

Description will be made on the evaluation methods related to the multilayer copper clad laminates and insulating resin boards for use in evaluation fabricated in the above described Examples and Comparative Examples. As for the multilayer copper clad laminates, the following items (1) to (4) were evaluated.

(1) Evaluation of the Embedding Property of the Inner Layer Component

This evaluation is concerned with investigation as to whether the voids were generated in the inner layer circuit cans on attachment onto the inner layer component. No void generation is indicated by the symbol "O" and a void generation by the symbol "X".

(2) Evaluation of Solder Heat Standing Property

According to a method in compliance with JIS C 6481, a fragment of a board was dipped into a solder bath at 260° C. and the measurement was made on the time elapsed until swelling occurs.

(3) Evaluation of Copper Foil Peel Strength

In compliance with JIS C 6481, a circuit of 0.2 mm in width was formed by etching and the peel strength was measured.

(4) Evaluation of Laser Drilling Workability

The time required to drill 1000 via holes of 100 μm in diameter by use of a carbon dioxide laser drilling machine was measured and the shape characteristics such as drilled hole diameters were inspected. In this case, the irradiation conditions of the carbon dioxide laser were that the frequency was 2000 Hz, the mask diameter was 5.0 mm, the pulse width was 60 μsec, the pulse energy was 16.0 mJ, the offset was 0.8, the laser light diameter was 130 μm, and the hole diameter intended to form was 100 μm.

Now, description will be made below on the evaluation items applied to the insulating resin boards for use in evaluation. The evaluation items for the insulating resin board are the following two items I) and II) mainly concerned with the strength as the insulating resin board.

I) Evaluation of Bending Strength

The bending strengths of the insulating resin boards for use in evaluation were measured in compliance with JIS K 7171.

II) Evaluation of Thermal Expansion Coefficient

The thermal expansion coefficients of the insulating resin boards for use in evaluation were measured in compliance with a test method described in the paragraph 2.4.24.5 in IPC-TM-650 which specifies the test method of IPC standard.

TABLE 1

| Evaluation item | Unit | Example 1 | Example 2 | Example 3 | Example 4 | Comparative example 1 | Comparative example 2 |
| --- | --- | --- | --- | --- | --- | --- | --- |
| Embedding property of inner layer component | — | O | O | O | O | O | O |
| Solder heat standing property | sec | Equal to or larger than 600 | | | | Equal to or larger than 600 | Equal to or larger than 600 |
| Copper foil peel strength | Kgf/cm | 1.2 | | | | 1.2 | 1.2 |
| Laser drilling workability | Time sec / Shape | 120 / O | | 125 / O | | 90 / O | 180 / X |
| Bending strength | MPa | 280 | | 420 | | 95 | 550 |
| Thermal expansion coefficient | ppm/° C. | 15 | | 10 | | 60 | 20 |

Table 1 collects the evaluation results concerned with the items described above. The following facts are revealed from Table 1. First of all, a comparison between Examples reveals that the evaluation results of Example 1 and those of Example 2 are the same, while the evaluation results of Example 3 and those of Example 4 are the same. In other words, there occurs a large difference in a mechanical strength of the bending strength depending on the type of the skeletal component. As expected, the laser drilling workability seems to be somewhat better in the cases where a nonwoven fabric was used as the skeletal component. The thermal expansion coefficient has been found to be smaller in the cases where an SP glass cloth was used as the skeletal component.

From comparison between Examples and Comparative Examples, it has been found that the use of the copper foils with an insulating layer of Examples can deduce comparable performances with those deduced by use of the copper foils with an insulating layer of Comparative Examples, with respect to the three items among the evaluation items for the multilayer copper clad laminate, that is, the evaluation of the inner layer embedding property, the evaluation of the solder heat standing property, and the evaluation of the copper foil peel strength. However, there are differences among Examples and Comparative Examples regarding the evaluation of the laser drilling workability. As is anticipated, case most excellent in the laser drilling workability is the one where was used the copper foil with resin of Comparative Example 1 which did not contain such a skeletal component as a nonwoven fabric or a woven cloth. On the other hand, the case poorest in the laser drilling workability, in the sense that a long time was required for hole drilling and the stability in drilled hole shape was poor, is the case of Comparative Example 2 where was used the FR-4 base material containing a conventional glass cloth in the interior thereof. Thus, the laser drilling workability of the multilayer copper clad laminate which used the copper foil with an insulating layer related to the present invention is found to lie midway between that evaluated in Comparative Example 1 and that evaluated in Comparative Example 2.

Turning to the evaluation results for the insulating resin boards, the bending strengths evaluated in Examples related to the present invention are found to lie midway between that evaluated in Comparative Example 1 and that evaluated in Comparative Example 2. To be more specific, the insulating resin boards of Examples are inferior in strength to that containing FR-4 therein, but exhibit strengths increased by a factor of 2.5 or above as compared to that of the insulating board in Comparative Example 1 which used a conventional copper foil with resin known to have an insufficient strength; the bending strengths of the insulating resin boards of Examples are found to be increased drastically so that the risk of board cracking is diminished to a large extent. Particularly, the bending strengths evaluated in Examples 3 and 4 where an SP glass cloth was used are found to approach closer to that evaluated in Comparative Example 2.

As for the thermal expansion coefficients of the insulating resin boards for use in evaluation, the thermal expansion coefficients evaluated in Examples are smaller than those evaluated in Comparative Examples 1 and 2, and hence the insulating resin boards of Examples are regarded as excellent in the board dimensional stability. Taking the materials constituting the insulating layer as the resin and skeletal component, it is the resin that has the possibility of generating the largest thermal expansion. Accordingly, it seems natural that the thermal expansion coefficient evaluated in Comparative Example 1 where a copper foil with resin containing no skeletal component is largest. On the other hand, as compared to the insulating resin board of Comparative Example 2 which contain a conventional glass cloth as a skeletal component, the smaller thermal expansion coefficients have been found in either the insulating resin boards of Examples 1 and 2 which contain a nowoven fabric of aramid fiber or the insulating resin boards of Examples 3 and 4 which contain an SP glass cloth with a smaller number of glass cloth fibers in a strand.

INDUSTRIAL APPLICABILITY

As can be seen fro the above, the copper clad laminate fabricated by use of the copper foil with an insulating layer produced by the manufacturing method related to the present invention has a strength a little lower than that found for the case where the FR-4 base material is used, but carries on an excellent laser drilling workability, provides an excellent dimensional stability to the board through holding a small thermal expansion coefficient, and can prevent the board cracking through acquiring a strength in a degree free of problem from the standpoints of the conventional fabrication process of a copper clad laminate to make a printed circuit board, the loading weight to be applied when incorporated into electronic appliances, and such external loads as vibration. Thus, an excellent and high degree of quality stability can be achieved, as compared with the case where a copper foil with resin is used.

The invention claimed is:

1. A method of manufacturing a copper foil provided with a semi-cured insulating layer containing a backbone material on one side surface of the copper foil, said method comprising the steps of:
  1) providing on one side surface of the copper foil a liquid thermosetting resin layer containing a solvent;
  2) semi-curing said liquid thermosetting resin layer by drying to remove said solvent preliminarily;
  3) placing a nonwoven fabric or woven cloth serving as a backbone material onto said semi-cured thermosetting resin layer;
  4) heating said semi-cured thermosetting resin to flow and to allow said nonwoven fabric or woven cloth as the backbone material to be impregnated with the resin, and further allow the resin to exude to an opposite side of said nonwoven fabric or woven cloth to form a semi-cured insulating layer containing said nonwoven fabric or woven cloth on one side of the copper foil; and
  5) adjusting said thermosetting resin layer to be X–30 ($\mu$m) to X–3 ($\mu$m) in thickness in relation to a thickness (X ($\mu$m)) of the formed insulating layer.

* * * * *